United States Patent
Sugiyama et al.

(10) Patent No.: US 6,790,694 B2
(45) Date of Patent: Sep. 14, 2004

(54) HIGH FREQUENCY SEMICONDUCTOR MODULE, HIGH FREQUENCY SEMICONDUCTOR DEVICE AND MANUFACTURING METHOD FOR THE SAME

(75) Inventors: Toru Sugiyama, Tokyo (JP); Kouhei Morizuka, Kanagawa-ken (JP); Masayuki Sugiura, Kanagawa-ken (JP); Yasuhiko Kuriyama, Kanagawa-ken (JP); Yoshikazu Tanabe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 10/281,231

(22) Filed: Oct. 28, 2002

(65) Prior Publication Data

US 2004/0036167 A1 Feb. 26, 2004

(30) Foreign Application Priority Data

Aug. 21, 2002 (JP) .................................... P 2002-240529

(51) Int. Cl.$^7$ ............................................... H01L 21/92
(52) U.S. Cl. .................. 438/33; 438/113; 438/124; 438/127; 438/458; 438/459; 438/462; 438/666; 257/728

(58) Field of Search .................................. 257/728, 729; 438/113, 124, 127, 458, 459, 462, 666

(56) References Cited

U.S. PATENT DOCUMENTS 6,706,547 B2 * 3/2004 Sakamoto et al. ............ 438/33

FOREIGN PATENT DOCUMENTS

| JP | 5-47937 | 2/1993 |
| JP | 2606940 | 2/1997 |
| JP | 2634300 | 4/1997 |
| JP | 2001-308109 | 11/2001 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A high frequency semiconductor module, includes: a semiconductor chip having top and bottom surfaces; a semiconductor element merged in the semiconductor chip; a ground pad of the semiconductor element disposed on the top surface; a metal layer configured to connect to the ground pad and extend to sidewalls of the semiconductor chip; a ground metal arranged on a surface of a mounting substrate; and a conductive material formed on the ground, configured to connect the metal layer and the ground metal.

6 Claims, 7 Drawing Sheets

HIGH FREQUENCY SEMICONDUCTOR MODULE, HIGH FREQUENCY SEMICONDUCTOR DEVICE AND MANUFACTURING METHOD FOR THE SAME

CROSS REFERENCE TO RELATED APPLICATIONS

This application is based upon and claims the benefit of priority from prior Japanese Patent Application P2002-240529 filed on Aug. 21, 2002; the entire contents of which are incorporated by reference herein.

BACKGROUND OF THE INVENTION

1. Field of the Invention

The present invention relates to a semiconductor module, a semiconductor device, and a manufacturing method of a semiconductor module. In particular, it relates to a manufacturing method that reduces the ground inductance of a high frequency circuit.

2. Description of the Related Art

Compound semiconductors such as a gallium arsenide (GaAs) and the like have superior characteristics including a favorable high-speed operation capability and a favorable power conversion efficiency as compared to silicon (Si). Development and implementation is progressing regarding a monolithic microwave integrated circuit (MMIC), an integrated high frequency circuit that utilizes such characteristics of compound semiconductors. A power amplifier module is a kind of MMIC that uses, for example, gallium arsenic hetero-junction bipolar transistors (HBT), and is widely used in equipment such as mobile phones. As the size of such equipment is reduced, demand has emerged for reducing the size of built in semiconductor devices therein. MMICs that meet these demands are being fabricated. However, the problem of parasitic impedance in ground wiring and the like may occur in reducing the size of semiconductor devices. In high frequency circuits, the parasitic impedance of wiring connecting the semiconductor device, and in particular ground wiring, affects the high frequency characteristic. For example, as shown in FIG. 1, the connection between a signal pad 112 and a ground pad 111 formed on a semiconductor device, and a signal line 107 and a ground 105, respectively, on a mounting substrate 103 is implemented by bonding wires 118a and 118b. Since the ground connection between the semiconductor device on a semiconductor chip 121 and the mounting substrate 103 is made by the bonding wire 118b, ground inductance increases and the power gain of the power amplifier module deteriorates. In order to solve such problems regarding ground inductance, through-holes formed in the semiconductor substrate are used for the connection between the ground pad formed on a top surface of the semiconductor chip and the ground of the mounting substrate. With this method, after thinning semiconductor substrate, the through-holes are formed so as to pass through the semiconductor substrate from a bottom surface to the top surface, and a gold plating is formed on the entire area of the bottom surface of the semiconductor chip. It is thereby possible to make a ground connection without using wires, and ground inductance is drastically reduced. Nevertheless, this leads to a significant drop in yield since complicated processes are needed on a very thin semiconductor substrate, including a photolithography process on the bottom surface, an etching process to form the through-holes, and a plating process for the bottom surface. To avoid an etching process in forming the through-holes in a semiconductor substrate that already has been thinned, a proposed method includes, first forming through-holes in the top surface of the semiconductor substrate, forming a gold plated layer within each through-hole, polishing the bottom surface of the semiconductor substrate to expose the gold plated layer, and then forming a metal layer on the whole area of the bottom surface. However, with this method as well, the etching process to form the through-holes in the semiconductor substrate is necessary. Also, since process controlling in forming a cross-section of the through-holes appropriate for metallic filling is further required, complexity is not eliminated. Moreover, since individual chips are separated following formation of the metallic layer on the bottom surface of the thin semiconductor substrate, such a method causes yield to drop.

Thus the ground inductance may increase caused by the bonding wire with the earlier mounting configuration of high frequency semiconductor devices such as MMIC. In order to reduce the ground inductance, methods have been proposed to form the through-holes in a thin semiconductor substrate. However, a complicated process forming the through-holes or the like are required, in addition to regular fabrication processes for the semiconductor device.

SUMMARY OF THE INVENTION

A first aspect of the present invention inheres in a semiconductor module including: a semiconductor chip having top and bottom surfaces; a semiconductor element merged in the semiconductor chip; a ground pad of the semiconductor element disposed on the top surface; a metal layer configured to connect to the ground pad and extend to sidewalls of the semiconductor chip; a ground metal arranged on a surface of a mounting substrate; and a conductive material formed on the ground, configured to connect the metal layer and the ground metal.

A second aspect of the present invention inheres in a semiconductor device including: a semiconductor chip having top and bottom surfaces; a semiconductor element merged in the semiconductor chip; a ground pad of the semiconductor element arranged on the top surface; and a metal layer configured to connect to the ground pad and extend to sidewalls of the semiconductor chip.

A third aspect of the present invention inheres in a manufacturing method for a semiconductor module including: fabricating semiconductor elements and ground pads of the semiconductor elements, on a top surface of a semiconductor substrate; physically forming isolation trenches in isolation regions configured to divide the semiconductor substrate into a plurality of semiconductor chips; depositing a metal layer configured to connect to the ground pad and extend to the isolation trenches; separating the semiconductor substrate into the semiconductor chips at the isolation trenches by polishing a bottom surface of the semiconductor substrate across bottoms of the isolation trenches; disposing a conductive material to a ground metal arranged on a mounting substrate; and mounting one of the semiconductor chips on the conductive material configured to connect the metal layer with the ground metal with the conductive material.

DETAILED DESCRIPTION OF EMBODIMENTS

Figure 1:
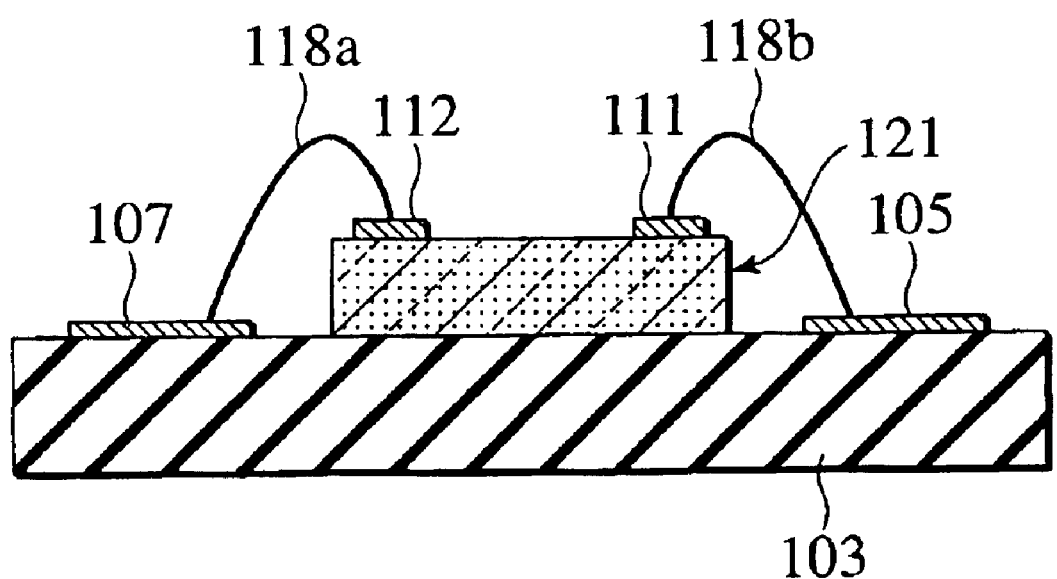
FIG. 1 is a schematic diagram of a conventional mounting configuration of a semiconductor chip.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
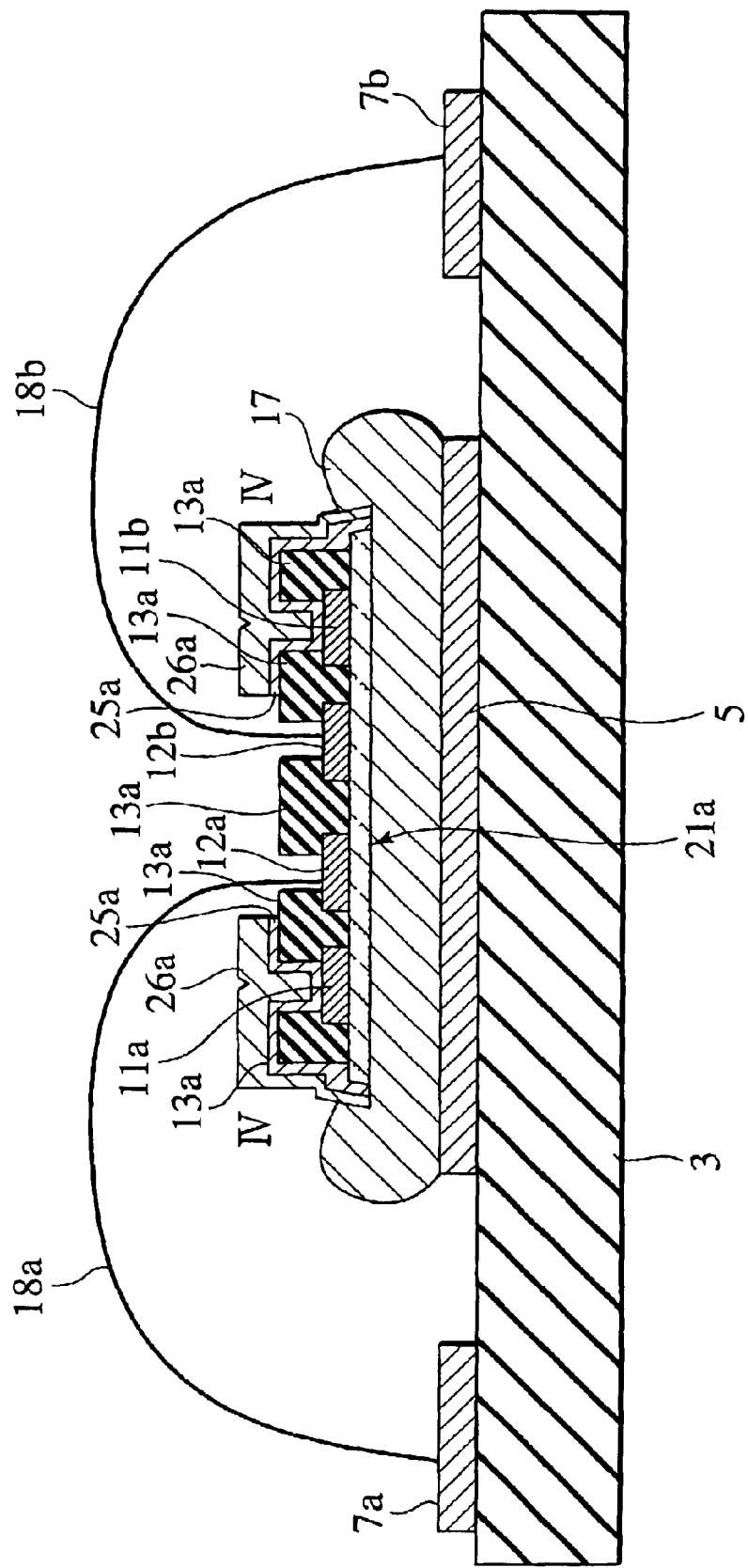
FIG. 2 is a schematic diagram showing the mounting configuration of a semiconductor chip on a semiconductor module according to an embodiment of the present invention.
Figure 4:
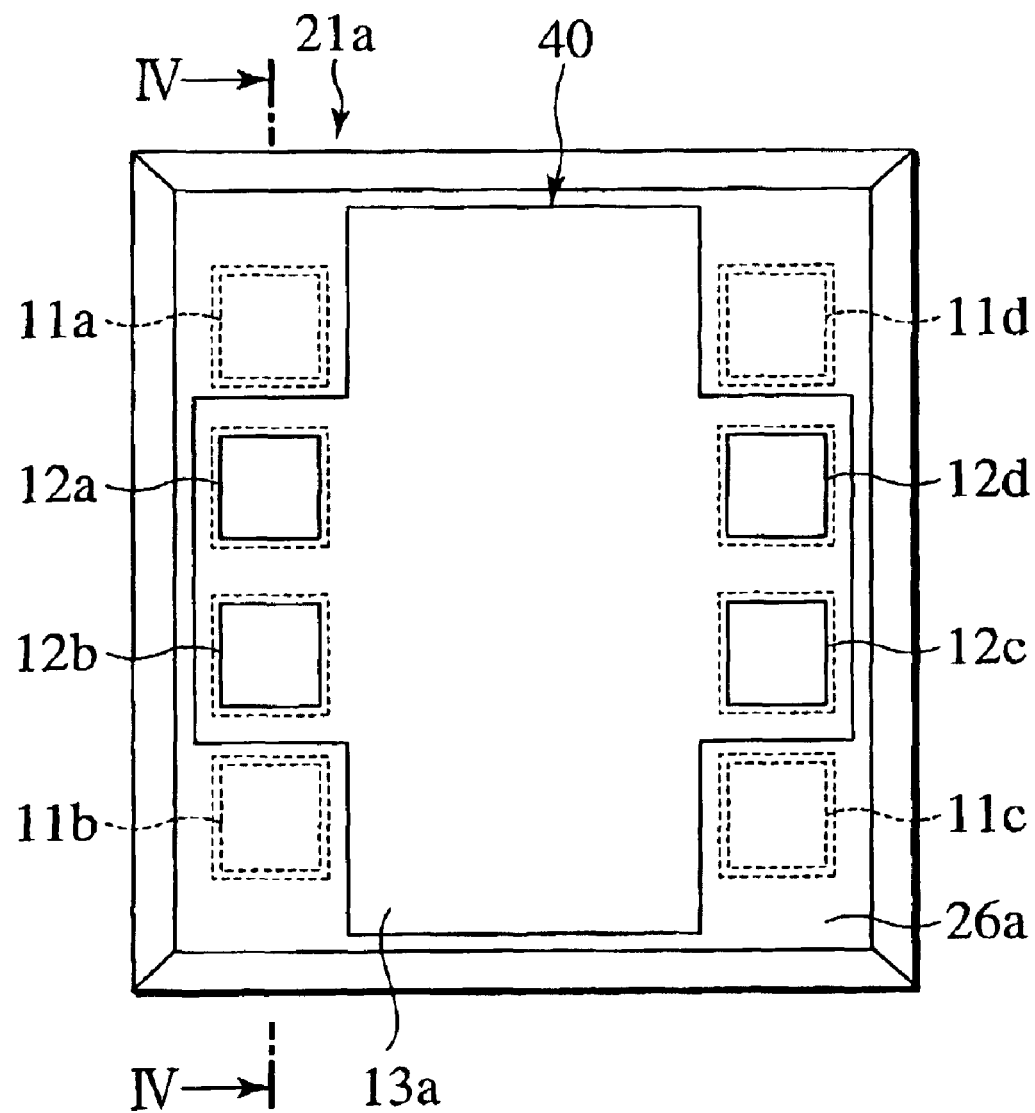
FIG. 4 is a top view of a block diagram of a semiconductor chip according to an embodiment of the present invention.

A semiconductor device scheduled to be assembled in a semiconductor module according to an embodiment of the present invention includes, shown in FIG. 2 corresponding to a cross sectional view at IV—IV line in FIG. 4, a semiconductor chip 21a having top and bottom surfaces, a semiconductor element merged in the semiconductor chip 21a, signal line pads 12a and 12b and ground pads 11a and 11b of the semiconductor element arranged on the top surface, and a ground metal layer 26 connected to the ground pads 11a and 11b and arranged so as to cover sidewalls of the semiconductor chip 21a.

The semiconductor element (omitted from the drawing) is merged in the semiconductor chip 21a so as to form an MMIC. The ground pads 11a and 11b and signal line pads 12a and 12b are fabricated from a metal film such as gold (Au) or aluminum (Al). The electrical connections of the ground pads 11a and 11b and the signal line pads 12a and 12b are respectively made through openings provided on an insulating film 13a, such as a silicon oxide ($SiO_2$) film or a silicon nitride ($Si_3N_4$) film. A ground foundation layer 25a such as a gold/titanium (Au/Ti) film is deposited on the ground pads 11a and 11b so as to cover the sidewalls of the semiconductor chip 21a via the insulating film 13a, and a ground metal layer 26a made of a gold plated layer, is further deposited upon the ground foundation layer 25a. The semiconductor chip 21a is placed onto a ground metal 5 made from a metal film such as a gold, on the mounting substrate 3 made of an insulator substrate such as an alumina substrate, and the ground pads 11a and 11b of the semiconductor chip 21a and the ground metal 5 of the mounting substrate 3 are connected using a conductive material 17 such as a silver (Ag) paste in contact with the ground metal layer 26a on the sidewalls of the semiconductor chips. In addition, the signal line pads 12a and 12b of the semiconductor chip 21a are connected to the signal lines 7a and 7b with a metal film such as gold, on the mounting substrate 3, through bonding wires 18a and 18b made of gold wires and the like. With the mounting substrate 3 according to the embodiment of the present invention, since the ground pads 11a and 11b of the semiconductor chip 21a are connected to the ground metal 5 of the mounting substrate 3 by the conductive material 17 in contact with the ground metal layer 26a, there is no longer any need for bonding wires to make the ground connection between the semiconductor chip 21a and the mounting substrate 3, and accordingly, ground inductance may be reduced. Moreover, as bonding pads for the ground wiring are no longer necessary, dimensions of the semiconductor chip 21a and the mounting substrate 3 may be reduced.

A manufacturing process for the semiconductor chips 21a, 21b, 21c, . . . according to the embodiment of the present invention is now described using cross-sectional views, shown in FIGS. 3A–3F.

Figure 3A:
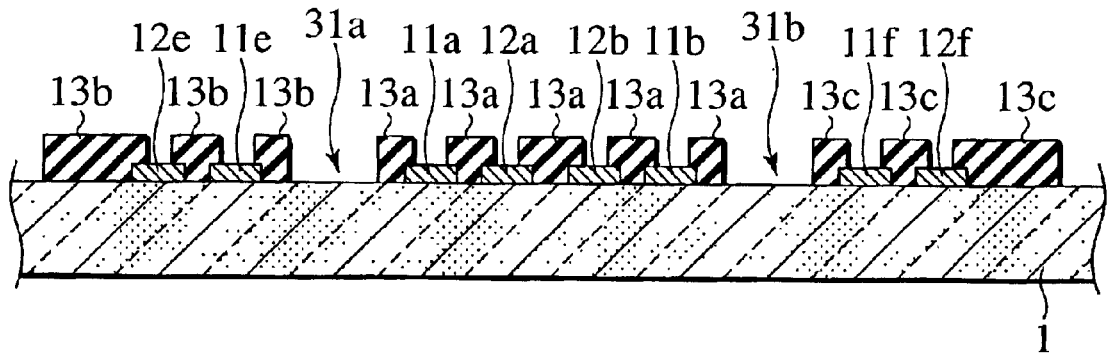
FIGS. 3A through 3F are cross-sectional diagrams describing the manufacturing process of a semiconductor chip according to an embodiment of the present invention.

(a) As shown in FIG. 3A, the MMIC (omitted from the drawing) including the HBT, and the ground pads 11a, 11b, 11e, and 11f and the signal line pads 12a, 12b, 12e, and 12f are fabricated on the top surface of the semiconductor substrate 1. To the ground pads 11a, 11b, 11e, and 11f and the signal line pads 12a, 12b, 12e, and 12f, gold metal films are applied. Thereafter, insulating films 13a through 13c having openings, are formed upon the top surface of the semiconductor substrate 1 in dicing lane (isolation region) 31a and 31b and a portion of the surface of the ground pads 11a, 11b, 11e, and 11f and signal line pads 12a, 12b, 12e, and 12f. The dicing lane 31a and 31b may separate the semiconductor elements with respect to each semiconductor chip.

Figure 3B:
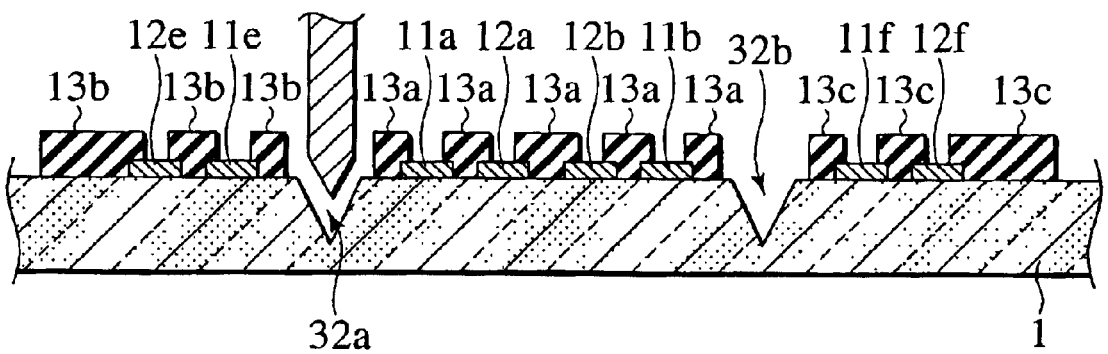

(b) Thereafter, as shown in FIG. 3B, isolation trenches 32a and 32b having a depth of, for example, 100 µm are formed in the dicing lanes 31a and 31b from the top surface of the semiconductor substrate 1 using a blade 100 of a dicing apparatus. Using a blade 100 with a V-shaped edge, a normal mesa shape is formed, on a cross-section view, so as to provide tapered sidewalls of the isolation trenches 32a and 32b.

Figure 3C:
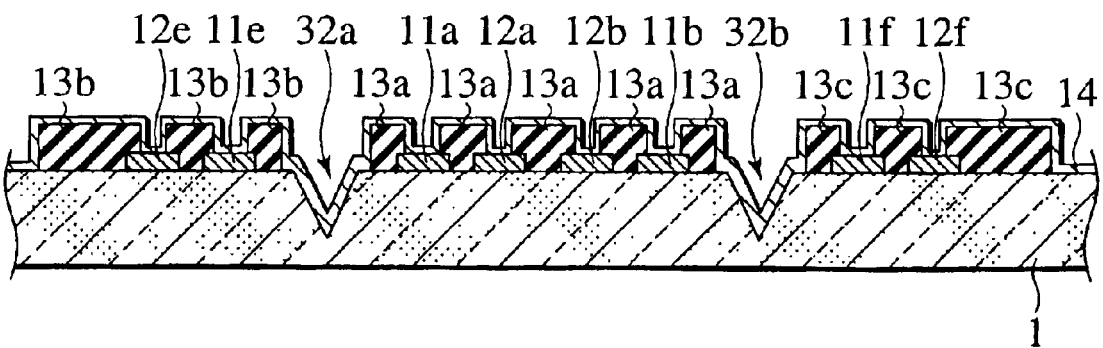

(c) As shown in FIG. 3C, a feed metal layer 14 is formed by depositing a gold/titanium film onto the top surface of the semiconductor substrate 1 to a thickness of approximately 100 nm. Since the sidewalls of the isolation trenches 32a and 32b are tapered, the feed metal layer 14 may be formed to sufficient thickness on the tapered sidewalls of the isolation trenches 32a and 32b. A titanium layer is inserted to improve adhesion strength between the gold metal layer and the insulating films 13a through 13c or the semiconductor substrate 1, and has a thickness ranging from several nanometers to several dozen nanometers.

Figure 3D:
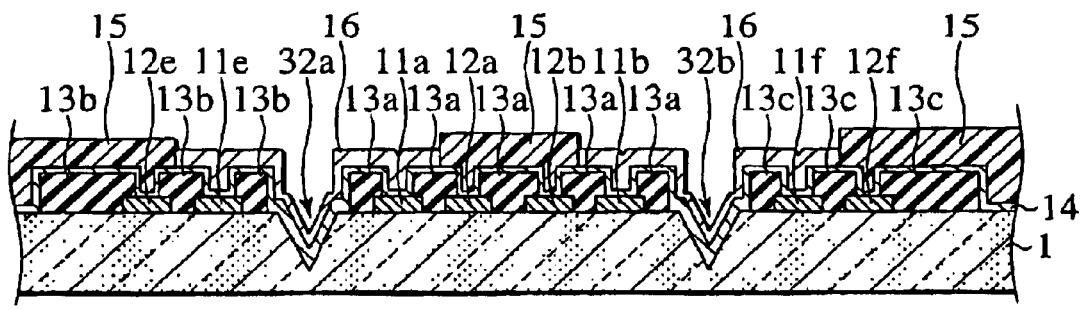

(d) Next, as shown in FIG. 3D, a photoresist film 15 is formed, which has openings exposing the region including the ground pads 11a and 11b and isolation trenches 32a and 32b arranged on the top surface of the semiconductor substrate 1. Thereafter, while in the electrolytic plating fluid, electric current is supplied through the feed metal layer 14 to perform selective electrolytic gold plating and form a plated layer 16 with a thickness of 2 µm. However, care should be taken so that the gold plating does not completely fill in the isolation trenches 32a and 32b.

Figure 3E:
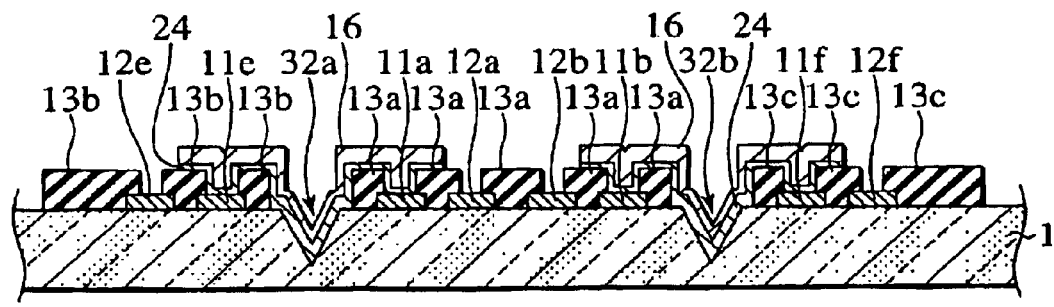

(e) After removing the photoresist film 15, the gold/titanium film of the exposed feed metal layer 14 is removed through a process such as ion milling, and as shown in FIG. 3E, a ground foundation layer 24 is formed under the plated layer 16.

Figure 3F:
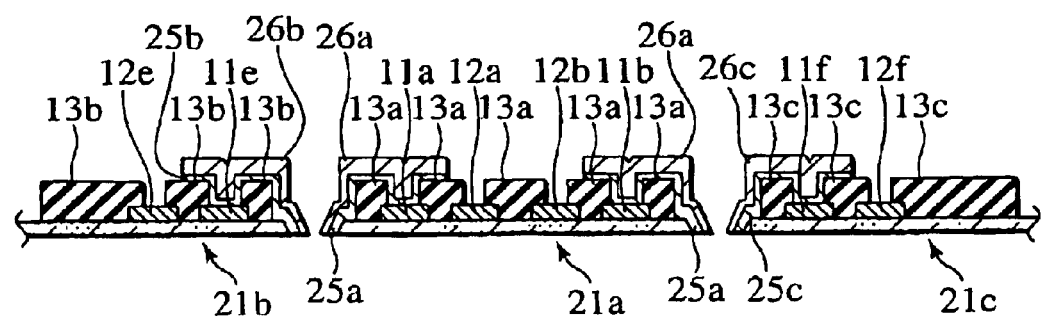

(f) Thereafter, a polishing process for a bottom surface of the semiconductor substrate 1 is performed. As the semiconductor substrate 1 is made thin through the polishing process, at a thickness of approximately 100 µm, the ground foundation layer 24 and the plated layer 16 in bottoms of the isolation trenches 32a and 32b become exposed. By continuing the polishing process to make the thickness of the semiconductor substrate 1 between 50 and 80 μm, as shown in FIG. 3F, semiconductor chips 21a through 21c are separated into individual pieces. Sidewalls of the semiconductor chips 21a through 21c are covered with ground foundation layers 25a through 25c and ground metal layers 26a through 26c.

By performing the bottom surface polishing after filling the inside of the isolation trenches 32a and 32b with a substance capable to remove in a post process such as a resist or a wax, the ground foundation layer films 25a through 25c and the ground metal layers 26a through 26c may be cleanly fabricated. "Cleanly fabricated" means that polishing is performed in a manner such that neither the ground foundation layer films 25a through 25c nor the ground metal layers 26a through 26c are peeled away from the semiconductor chips 21a through 21c, and neither the ground foundation layer films 25a through 25c nor the ground metal layers 26a through 26c remain on bottom surface portions of the semiconductor chips 21a through 21c.

As shown in FIG. 4, the ground metal layer 26a connected to the ground pads 11a through 11d of the fabricated semiconductor chip 21a covers the sidewalls of the semiconductor chip 21a, extending from the periphery of a semiconductor element region 40 having the signal line pads 12a through 12d in the insulating film 13a. In addition, the semiconductor chip 21a is assembled in the semiconductor module, as shown in FIG. 2, by being mounted onto the ground metal 5 arranged on the mounting substrate 3 using the conductive material 17 such as the silver paste. The conductive material 17 is formed so as to connect the ground metal layer 26a of the semiconductor chip 21a with the ground metal 5 of the mounting substrate 3.

With the method of manufacturing the semiconductor chip 21a according to the embodiment of the present invention, the isolation trenches 32a and 32b are physically formed in the dicing lanes 31a and 31b provided between the semiconductor element regions 40 using the blade 100. Accordingly, the process of forming the isolation trenches 32a and 32b is simplified. It should be noted that using the blade 100 with the V-shaped edge provides the taper of the normal mesa shapes to the sidewalls of the isolation trenches 32a and 32b. An angle of the V-shaped edge of the blade 100 may be as sharp as is possible. In cases where the V-shaped edge of the blade 100 is blunter, the amount of chip area that is lost increases because the dicing lane width is widened.

Figure 5:
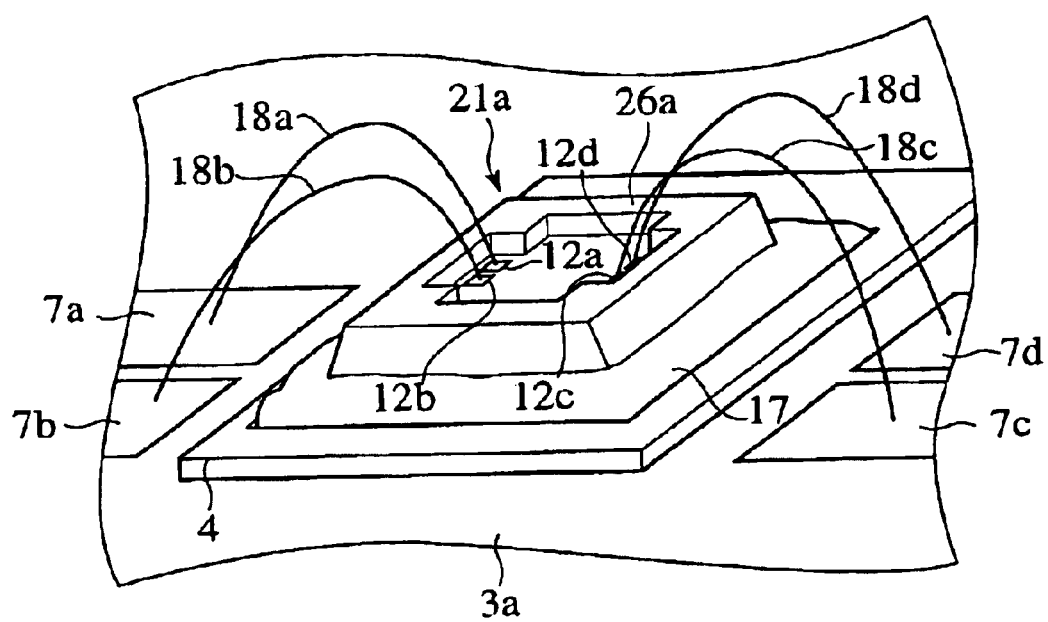
FIG. 5 is a schematic diagram showing the mounting configuration of a semiconductor chip on a semiconductor module according to an embodiment of the present invention.

In addition, as shown in FIG. 5, a glass coat 4 having a projecting shape may be arranged upon the mounting substrate 3a so as to enclose the region where the semiconductor chip 21a is to be mounted. The semiconductor chip 21a may be then placed in a hollow space of the glass coat 4. The signal line pads 12a through 12d of the semiconductor chip 21a are connected to the signal lines 7a through 7d upon the mounting substrate 3a through bonding wires 18a through 18b. The glass coat 4 makes it possible to keep the conductive material 17 from spreading into the surrounding areas when mounting the semiconductor chip 21a onto the mounting substrate 3a. The glass coat 4 may be formed, for instance, by processing the mounting substrate 3a, or alternatively may be formed by attaching an insulating material such as silica glass to the mounting substrate 3a. The conductive material 17 may be filled in the gap between the semiconductor chip 21a and the glass coat 4. The conductive material 17 is filled so as to reach at least the level of the height of projection of the glass coat 4 at the sidewalls of the semiconductor chip 21a. Accordingly, the glass coat 4 allows a secure contact with the conductive material 17 between the ground metal 5 and the ground metal layer 26a fabricated from the gold plated layer on the sidewall of the semiconductor chip 21a.

Figure 6:
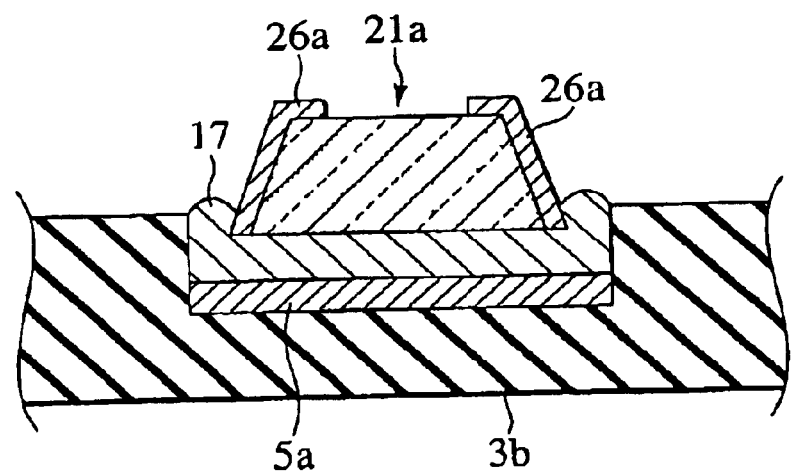
FIG. 6 is a schematic diagram showing the mounting configuration of a semiconductor chip on a semiconductor module according to an embodiment of the present invention.

Alternatively, as shown in FIG. 6, it is possible to keep the conductive material 17 from spreading into the surrounding areas by forming the ground metal 5a of the mounting substrate 3b on a bottom of a shallow recess, and then mounting the semiconductor chip 21a. The conductive material 17 may be filled in the gap between the semiconductor chip 21a and the sidewalls and the bottom of the recessed. The conductive material 17 is filled so as to reach at least the level of the height of the sidewalls of the recess at the sidewalls of the semiconductor chip 21a. Accordingly, arranging the ground metal 5a on the bottom of the recess in this manner allows a secure contact with the conductive material 17 between the ground metal 5a and the ground metal layer 26a fabricated with a gold plated layer on the sidewalls of the semiconductor chip 21a.

With the method of manufacturing the semiconductor module according to the embodiment of the present invention, ground inductance may be easily reduced, and it becomes possible to reduce the dimensions of the semiconductor chip 21a and make the mounting substrate smaller.

The ground metal layer 26a may also be formed using a method other than electrolytic plating. For instance, a method may be used where a gold/titanium film having a thickness of 2 μm is formed on the surface of the semiconductor substrate using a vacuum deposition, sputtering, or the like. A resist mask is then formed, and unnecessary portions of the gold/titanium film are removed with etching. With the electrolytic plating method, it is necessary to expose the resist film with light inside the isolation trenches 32a and 32b having a depth of 100 μm and then to remove the resist film through a developing step. However, with the method of removing the gold/titanium film using etching, there is no need to remove the resist film from inside the deep isolation trenches 32a and 32b, and accordingly, the process is simplified.

(Modified Example)

The method of manufacturing a semiconductor module according to a modified example of the embodiment of the present invention has a feature where the semiconductor chip 21a has sidewalls prescribed as being parallel to the [001] and [010] directions. As the remainder is similar to the embodiment of the present invention, repetitive descriptions are omitted.

Figure 7:
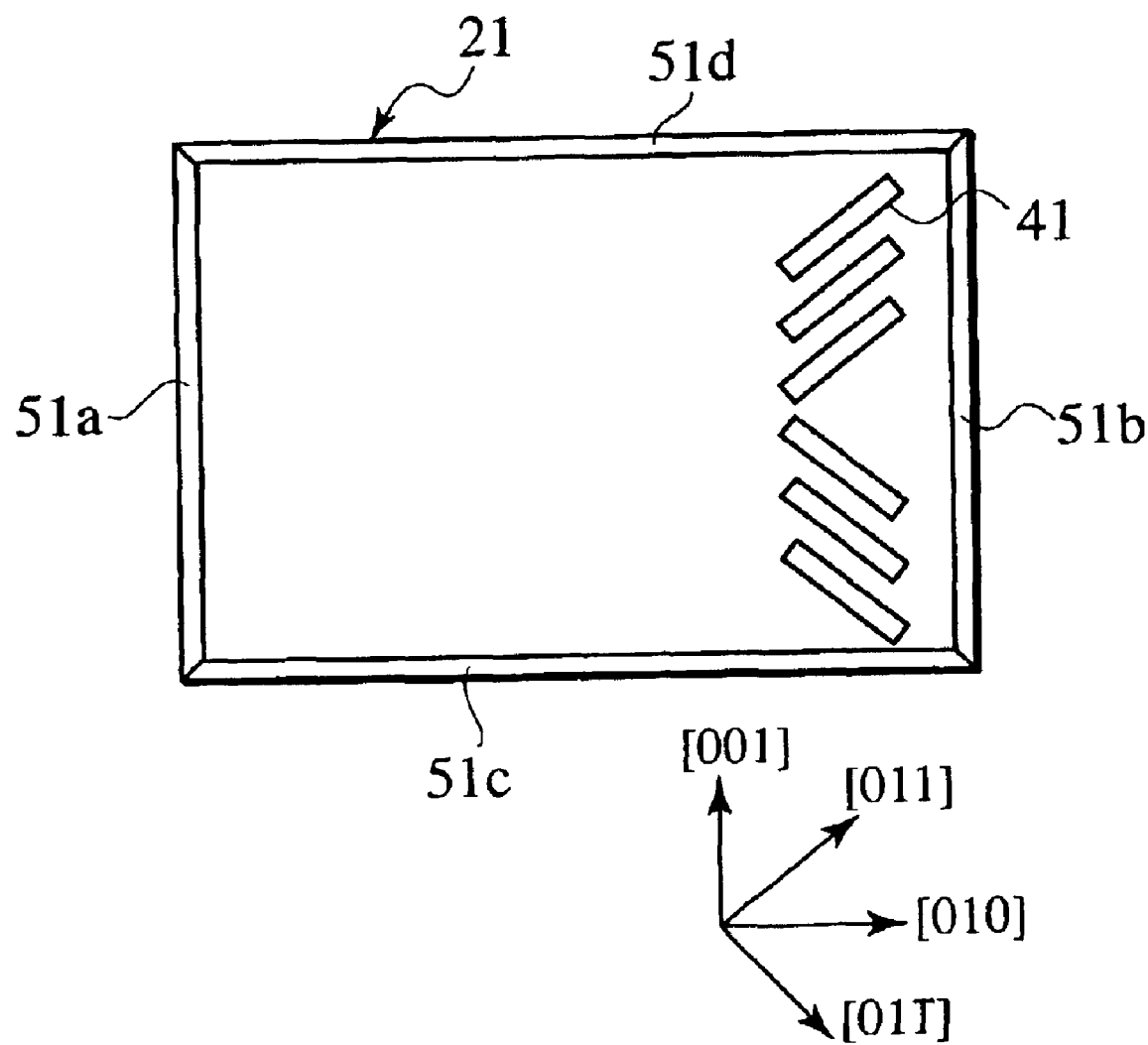
FIG. 7 is a top view of a block diagram of a semiconductor chip according to a modified example of the present invention.

With a semiconductor chip 21a of the semiconductor module according to the modified example of the embodiment of the present invention, in a semiconductor element including an HBT fabricated on a semiconductor substrate 1 with a plane direction (100) given as a top surface as shown in FIG. 7, the semiconductor chip 21a is defined by sidewalls 51a through 51d that are parallel to the [001] and [010] directions, and emitter regions 41 of the HBT are defined as rectangular shapes that are parallel to the [011] and [01$\bar{1}$] directions. In a typical semiconductor element manufacturing process for a compound semiconductor such as GaAs, the direction of dicing lane is prescribed as being so that the sidewalls 51a through 51d of the semiconductor chip 21a lie parallel to the [011] and [01$\bar{1}$] directions. In the GaAs or similar compound semiconductors, the [011] and [01$\bar{1}$] directions are the directions of cleavage. Accordingly, dicing is made easier because the dicing lane is substantially lined up with the direction of cleavage. Nevertheless, with the method of manufacturing a semiconductor device according to the embodiment of the present invention, isolation trenches are formed with a blade 100 along the direction of the dicing lane. If the dicing lane is aligned along the [011] and [01$\bar{1}$] directions of the cleavage, it is highly possible that cleavage may occur along the isolation trenches during formation of the isolation trenches. Therefore, as with the modified example of the embodiment of the present invention, cleavage during formation of the isolation trenches may be prevented by aligning the dicing lane along the [001] and [010] directions that are shifted 45° from the directions of cleavage. Physical and chemical characteristics of a compound semiconductor vary with the plane direction. For instance, with chemical etching that uses an HBT emitter fabrication process, an etching rate shows an anisotropic performance, and the width of side etching differs between orthogonal edges of a rectangular etching mask. Accordingly, when the etching is performed so as to leave the emitter regions 41 remaining, the photomask for the emitter fabrication process is designed in consideration of the anisotropy of the side etching in order to prevent variation in the dimensions of the emitters from designed values. In the modified example of the embodiment of the present invention, since the HBT emitter is prescribed as being a rectangular shape parallel to the typical [011] and [01$\bar{1}$] directions, the typical process conditions for fabricating the emitters may be applied without modification. In addition, cleavage may also be prevented, if the dicing lane are shifted approximately 10° from the cleavage directions. Accordingly, the same effects preventing cleavage, may be obtained if the isolation trenches are fabricated so that the sidewalls 51*a* through 51*d* of the semiconductor chip 21*a* are shifted more than 10° from the [011] and [01$\bar{1}$] directions of the cleavage.

With the method of manufacturing the semiconductor module according to the modified example of the embodiment of the present invention, the cleavage of the semiconductor substrate during isolation trench fabrication process may be prevented, ground inductance may be easily reduced, and it becomes possible to reduce the dimensions of the semiconductor chip and make the mounting substrate smaller.

(Other Embodiments)

Various modifications will become possible for those skilled in the art after receiving the teachings of the present disclosure without departing from the scope thereof.

In the embodiment of the present invention, an MMIC using an HBT as the semiconductor element was illustrated. However, the same results may naturally also be obtained with an MMIC that uses, for example, a metal-semiconductor field-effect transistor (MESFET) or a high electron mobility transistor (HEMT) or the like. Furthermore, while the blade 100 was described as the blade of the dicing apparatus, a blade of, for example, a semiconductor wafer scriber may naturally also be used.

What is claimed is:

1. A manufacturing method for a high frequency semiconductor module, comprising:

fabricating semiconductor elements and ground pads of the semiconductor elements, on a top surface of a semiconductor substrate;

physically forming isolation trenches in isolation regions configured to divide the semiconductor substrate into a plurality of semiconductor chips;

depositing a metal layer configured to connect to the ground pad and extend to the isolation trenches;

separating the semiconductor substrate into the semiconductor chips at the isolation trenches by polishing a bottom surface of the semiconductor substrate across bottoms of the isolation trenches;

disposing a conductive material to a ground metal arranged on a mounting substrate; and mounting one of the semiconductor chips on the conductive material configured to connect the metal layer with the ground metal with the conductive material.

2. The manufacturing method of claim 1, wherein the semiconductor substrate has the top surface being identified as a (100) plane, and the isolation trenches are aligned along [010] and [001] directions.

3. The manufacturing method of claim 2, wherein the semiconductor element is a hetero-junction bipolar, and an emitter region of the hetero-junction bipolar transistor is formed in a rectangular shape having edges that are parallel to the [011] and [01$\bar{1}$] directions.

4. The manufacturing method of claim 1, wherein the isolation trenches are fabricated with a blade having a V-shaped edge.

5. The manufacturing method of claim 4, wherein the semiconductor substrate has the top surface being identified as a (100) plane, and the isolation trenches are aligned along [010] and [001] directions.

6. The manufacturing method of claim 5, wherein the semiconductor element is a hetero-junction bipolar transistor, and an emitter region of the hetero-junction bipolar transistor is formed in a rectangular shape having edges that are parallel to the [011] and [01$\bar{1}$] directions.

* * * * *